(12) United States Patent
Hiura

(10) Patent No.: US 6,891,175 B2
(45) Date of Patent: May 10, 2005

(54) EXPOSURE APPARATUS AND DEVICE MANUFACTURING METHOD USING THE SAME

(75) Inventor: Mitsuru Hiura, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 301 days.

(21) Appl. No.: 09/915,325

(22) Filed: Jul. 27, 2001

(65) Prior Publication Data

US 2002/0024646 A1 Feb. 28, 2002

(30) Foreign Application Priority Data

Aug. 1, 2000 (JP) ........................................ 2000-233196

(51) Int. Cl.⁷ .............................. A61N 5/00; H01J 37/08
(52) U.S. Cl. ............................. 250/492.22; 250/492.2
(58) Field of Search ......................... 250/492.2, 492.22

(56) References Cited

U.S. PATENT DOCUMENTS 5,621,216 A * 4/1997 Clarke et al. .......... 250/492.22
6,100,515 A * 8/2000 Nishi et al. ................. 250/205
6,538,723 B1 3/2003 Hagiwara et al. ............. 355/67

FOREIGN PATENT DOCUMENTS

| JP | 7-130626 | 5/1995 |
| JP | 10-223513 | 8/1998 |
| JP | 10-270345 | 10/1998 |

* cited by examiner

Primary Examiner—Stephen D. Meier
Assistant Examiner—Alfred Dudding
(74) Attorney, Agent, or Firm—Fitzpatrick, Cella, Harper & Scinto

(57) ABSTRACT

A scanning exposure apparatus includes a master stage for scanning a master, a substrate stage for scanning a substrate, a transfer device for supplying/recovering the substrate to/from the substrate stage, a positioning device for relatively positioning the substrate and the master, and a scanning velocity determination device for determining a scanning velocity so as to maximize the number of substrates that can be exposed per unit time.

13 Claims, 12 Drawing Sheets

FIG. 10

```
URL  http://www.maintain.co.jp/db/input.html

TROUBLE DB INPUT WINDOW

OCCURRENCE DATE  [2000/3/15]~1404
TYPE OF APPARATUS [**********]~1401
OBJECT [OPERATION ERROR (START-UP ERROR)]~1403
APPARATUS S/N [465NS4580001]~1402
DEGREE OF URGENCY [D]~1405
SYMPTOM   LED KEEPS FLICKERING
          AFTER POWER-ON              ~1406

REMEDY    POWER ON AGAIN
          (PRESS RED BUTTON IN ACTIVATION) ~1407

PROGRESS  INTERIM HAS BEEN DONE        ~1408

[SEND] [RESET]      1410              1411              1412
LINK TO RESULT LIST DATABASE    SOFTWARE LIBRARY   OPERATION GUIDE
```

SEMICONDUCTOR DEVICE MANUFACTURING FLOW

WAFER PROCESS

EXPOSURE APPARATUS AND DEVICE MANUFACTURING METHOD USING THE SAME

FIELD OF THE INVENTION

The present invention relates to an exposure apparatus used in a lithography step of the steps in manufacturing a device, e.g., a semiconductor device such as an IC or LSI, a liquid crystal device, an image sensing device such as a CCD, or a magnetic head, and a device manufacturing method using the exposure apparatus.

BACKGROUND OF THE INVENTION

In a manufacturing process of a semiconductor integrated circuit, an exposure apparatus is used to form a pattern on a photosensitive material (to be referred to as a "resist" hereinafter) on a substrate (to be referred to as a "wafer" hereinafter). With an increase in the area of recent semiconductor integrated circuits and an advance in micropatterning, a scanning exposure apparatus called a step-and-scan exposure apparatus designed to illuminate part of a pattern on a mask as a master in the form of a slit, and to perform exposure by synchronously scanning the mask and a wafer at a constant velocity is replacing a conventional step-and-repeat exposure apparatus, a so-called stepper, which is designed for cell projection of a mask pattern.

In general, a proper exposure amount (to be referred to as a "set exposure amount" hereinafter) D (J/m$^2$) for the formation of a proper mask pattern image is set for a resist. A scanning velocity V (mm/sec) in the scanning exposure apparatus must satisfy $$V \leq I\text{max}/D \times Ws \qquad (1)$$

where Imax (W/m$^2$) is the maximum exposure illuminance of exposure light on a wafer, and Ws (mm) is the exposure slit width on the wafer in a non-scanning direction.

According to inequality (1), the maximum scanning velocity controlled by the set exposure amount D is given by $$Vd = I\text{max}/D \times Ws \qquad (2)$$

A maximum scanning velocity Vmax determined from the performance of a stage control system, including structural/mechanical performance, is substantially determined in the scanning exposure apparatus, and the scanning velocity V must satisfy $$V \leq V\text{max} \qquad (3)$$

One of the factors responsible for the above requirement is that the positions of a mask and wafer cannot be properly controlled to result in a deviation (to be referred to as a "synchronization error" hereinafter), i.e., a deviation from a predetermined positional relationship between the mask and the wafer, in the scanning exposure apparatus designed to form a mask pattern on the wafer by scanning/exposing the mask and wafer while performing synchronous control to keep the positions of the mask and wafer in the predetermined positional relationship. This leads to a decrease in the resolution of a resist pattern and a deviation from the proper imaging position of the resist pattern, resulting in trouble in the manufacture of a semiconductor integrated circuit. This synchronization error is almost proportional to the scanning velocity. As the scanning velocity increases, the synchronization error increases. For this reason, the maximum scanning velocity Vmax that suppresses the synchronization error with an allowable synchronization error range is determined.

If a pulsed light source such as a KrF excimer laser or an ArF excimer laser is used as an exposure light source to meet the requirement for micropatterning, since pulsed light varies in energy for each pulse, an integrated exposure amount is made uniform within a desired precision by performing exposure with a plurality of pulsed light beams equal to or larger than a predetermined pulse count (to be referred to as a "minimum exposure pulse count" hereinafter) Pmin. For this reason, in the scanning exposure apparatus, the following inequality must be satisfied:

$$P\text{min} \leq Ws/V \times f \qquad (4)$$

where f (Hz) is the oscillation frequency of the exposure light source laser.

According to the inequality, letting fmax be the maximum oscillation frequency of the exposure light source laser, the maximum scanning velocity controlled by the minimum scanning velocity controlled by the minimum exposure pulse count Pmin is given by $$Vp = Ws/P\text{min} \times f\text{max} \qquad (5)$$

Conventionally, as disclosed in, for example, Japanese Patent Laid-Open Nos. 10-270345 and 10-223513, a scanning velocity is determined with the oscillation frequency fmax when a low-sensitivity resist with the large set exposure amount D is to be used, or a scanning velocity is determined to set the maximum scanning velocity Vmax when a high-sensitivity resist with the small set exposure amount D is to be used, so as to satisfy inequalities (1), (3), and (4).

If the integrated exposure amount can be set to Pmin regardless of the maximum scanning velocity Vd controlled by the set exposure amount D represented by equation (2), the maximum scanning velocity Vmax controlled in accordance with the performance of the apparatus, and the value of the set exposure amount D, the minimum value of Vp controlled in accordance with the performance of the apparatus, and the value of the set exposure amount D, the minimum value of Vp controlled by the minimum exposure pulse count represented by equation (5) is determined as a scanning velocity in actual exposure operation.

An important item in manufacturing a semiconductor integrated circuit is a reduction in the size of an integrated circuit pattern. This is mainly associated with optical imaging performance and the performance of a stage control system, in particular, a in a scanning exposure apparatus.

In manufacturing a semiconductor integrated circuit, about 10 to 20 exposure processes are repeatedly performed for one wafer. As a reduction in integrated circuit pattern size, an increase in overlay accuracy of integrated circuit patterns between the respective exposure processes is associated with one of important abilities.

In the manufacturing process of a semiconductor integrated circuit, another important factor is productivity. The productivity of an exposure apparatus increases as the time required to expose one wafer shortens, i.e., the number of wafers that can be exposed per unit time (to be referred to as a "throughput" hereinafter) increases.

In a conventional scanning velocity determination method, exposure is performed at the smallest value of the maximum scanning velocity Vd controlled by the set exposure amount D, the maximum scanning velocity Vmax controlled from the performance of the apparatus, and the maximum scanning velocity Vp controlled by the minimum exposure pulse count, i.e., the highest possible scanning velocity of the maximum scanning velocities Vd, Vmax, and Vp.

This indicates that the throughput increases as the scanning velocity increases. Obviously, in a scanning exposure apparatus designed to illuminate a pattern area to be exposed in the form of a slit and to perform exposure by synchronously scanning a mask and wafer at a constant velocity, the time required to scan the pattern area to be exposed shortens as the scanning velocity increases while the length of the pattern area to be exposed in the scanning direction remains unchanged.

However, after one pattern area is exposed, both the mask stage and the wafer stage are temporarily stopped. Thereafter, the next pattern area is exposed by scanning the stages in the opposite direction. To increase the mask and wafer scanning velocities, therefore, is to prolong the time required to accelerate each scanning velocity to the above scanning velocity and the time required to decelerate each of the mask and wafer scanning velocities to 0. At a given scanning velocity or higher, the time required to scan a pattern area to be exposed shortens because of an increase in scanning velocity. However, the time required to accelerate each of the mask and wafer scanning velocities to the scanning velocity in the pattern area to be exposed and the time required to decelerate each scanning velocity to 0 is prolonged more than the time is shortened. As a result, the total time required to start driving a mask and wafer, to reach the scanning velocity in a pattern area to be exposed, and to complete a driving operation of the mask and wafer may be prolonged as the scanning velocity is increased, resulting in a reduction in throughput.

SUMMARY OF THE INVENTION

The present invention has been made in consideration of the above points, and has as its object to provide an exposure apparatus which has a scanning velocity determination means to maximize the throughput.

In order to achieve the above object, according to the present invention, there is provided a scanning exposure apparatus comprising: a master stage for scanning a master, a substrate stage for scanning a substrate, transfer means for supplying/recovering the substrate to/from the substrate stage, and positioning means for relatively positioning the substrate and the master, scanning velocity determination means for determining a scanning velocity so as to maximize the number of substrates that can be exposed per unit time, i.e., a throughput.

The scanning velocity determining means determines, as a scanning velocity in an actual exposure operation, a lowest one of a maximum scanning velocity determined from apparatus performance: Vmax, a scanning velocity determined from an exposure illuminance and a required exposure amount: Vd, and a scanning velocity at which the number of substrates that can be processed per unit time is maximized, which is determined from the transfer pattern size, a layout of the transfer pattern on the substrate, the transfer means, the master scanning means, the substrate stage scanning means, and the positioning means: Vt.

If the light source is a light source for emitting pulsed light, the scanning velocity determining means determines, as a scanning velocity in an actual exposure operation, a lowest one of a maximum scanning velocity determined from apparatus performance: Vmax, a scanning velocity determined from an exposure illuminance and a required exposure amount: Vd, a scanning velocity determined from the minimum number of pulses which is required for integration to ensure a uniform exposure amount: Vp, and a scanning velocity at which the number of substrates that can be processed per unit time is maximized, which is determined from the transfer pattern size, a layout of the transfer pattern on the substrate, the transfer means, the master scanning means, the substrate stage scanning means, and the positioning means: Vt.

More specifically, the scanning velocity Vp satisfies $$Vp = Ws/P\min \times f\max$$

where Ws is a width of an illumination area, on the substrate in a non-scanning direction, which illuminates part of the transfer pattern, fmax is a maximum frequency of pulsed light emitted from the light source, and Pmin is the minimum number of pulses required for integration to ensure a uniform exposure amount on the substrate.

The scanning velocity Vd satisfies $$Vd = I\max/D \times Ws$$

where Imax is a maximum exposure illuminance, and D is a required exposure amount determined by a photosensitive material.

The scanning velocity Vt is calculated by simulation to maximize the number of substrates that can be processed per unit time on the basis of the transfer pattern size, a layout of the transfer pattern on the substrate, and conditions in the master scanning means, the substrate stage scanning means, the transfer means, and the positioning means or satisfies $$V\text{scan.min} = \sqrt{\{L \times \alpha\text{accel} \times \alpha\text{decel}/(\alpha\text{accel} + \alpha\text{decel})\}}$$

$$Vt = g(V\text{scan.min})$$

where αaccel is an average acceleration with which an increase in scanning velocity from 0 to Vt is achieved, αdecel with which a decrease in scanning velocity from Vt to 0 is achieved, L is a length on the substrate which is scanned at a constant velocity in one scanning operation, and g( ) is an arbitrary function.

In this case, since the length L changes for each transfer pattern in accordance with the transfer pattern size and the layout of the transfer pattern on the substrate, the optimal value of Vt is determined to be changed for each transfer pattern. In addition, the scanning velocity Vt may be changed for each shot area to be exposed in accordance with the length that is scanned at a constant velocity in one scanning operation.

By determining a scanning velocity in this manner, a maximum throughput can always be obtained, and hence, the productivity of devices can be increased.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 10 is a view showing an example of a user interface in the exposure apparatus according to the present invention;

DETAILED DESCRIPTION OF THE PREFERRED EMBODIMENTS (First Embodiment)

Figure 1:
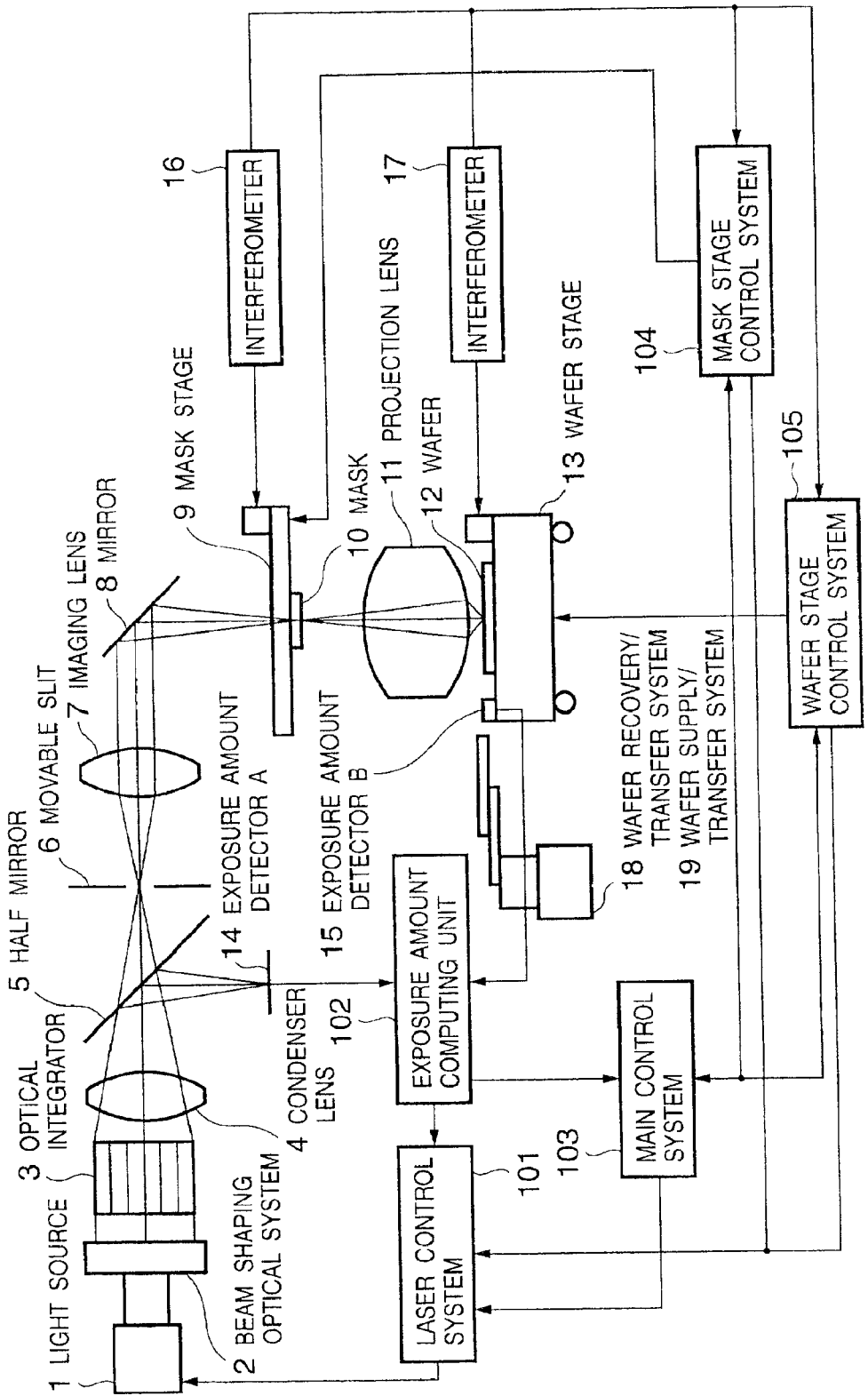
FIG. 1 is a schematic view showing the arrangement of an exposure apparatus according to an embodiment of the present invention.

FIG. 1 is a schematic view showing an exposure apparatus according to an embodiment of the present invention. In this case, a pulse laser such as an excimer laser is used as an exposure light source. A light beam L emitted from a light source 1 formed by a pulse laser such as an excimer laser is shaped into a predetermined shape by a beam shaping optical system 2 and incident on an optical integrator 3. The optical integrator 3 is formed by a flyeye lens constituted by a plurality of microlenses, and has a plurality of secondary sources near its light exit surface. Light beams from the secondary sources near the light exit surface of the optical integrator 3 illuminate, through a condenser lens 4, a movable slit 6 whose aperture shape can be changed. Reference numeral 14 denotes an exposure amount detector A for detecting the amount of part of illumination light split by a half mirror 5 and outputting the resultant signal to an exposure amount computing unit 102.

The light beams illuminating the movable slit 6 illuminate part of a circuit pattern, in the form of a slit, which is formed on a mask 10 serving as a master held on a mask stage 9, through an imaging lens 7 and mirror 8.

With a light beam in the form of a slit, which has passed through the mask 10, the circuit pattern on the mask 10 is reduced/projected, through a projection lens 11, on a wafer 12 having a surface coated with a resist as a photosensitive material. The wafer 12 serving as a substrate to be exposed is held on a wafer stage 13 that can be driven in the X, Y, and Z directions and tilt direction. An exposure amount detector B (15) is mounted on the wafer stage 13 to monitor an exposure amount through the projection lens 11. At an early stage in an exposure process, the correlation between the amount of exposure light that has passed through the projection lens 11 and detected by the exposure amount detector B (15) on the wafer stage 13 and the amount of exposure light that is detected by the exposure amount detector A (14) is obtained in advance, and actual exposure operation is controlled on the basis of the exposure amount detected by the exposure amount detector A (14).

Reference numeral 101 denotes a laser control system for controlling the output energy and oscillation frequency of the light source 1 by outputting a trigger signal and charging voltage signal in accordance with a desired set exposure amount. This apparatus includes a light attenuation means (not shown) and can adjust the amount of light from the light source 1.

Figure 2:
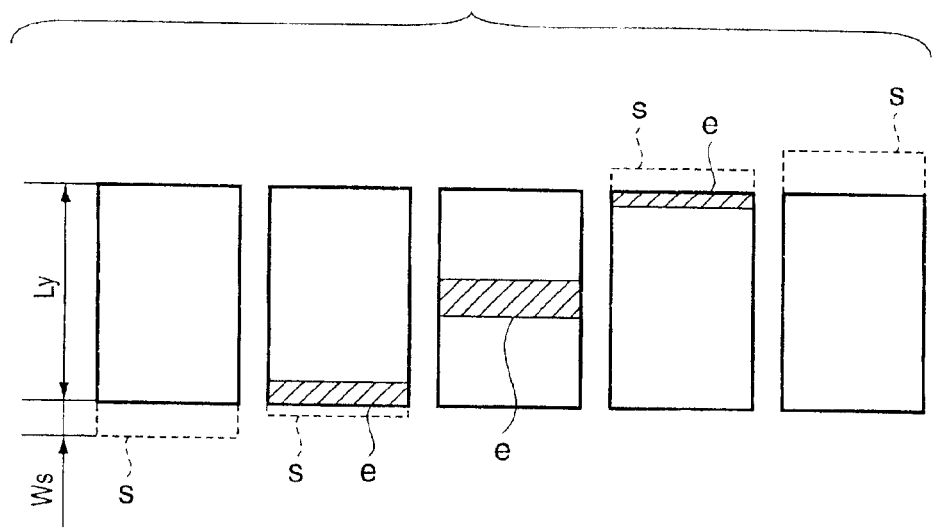
FIG. 2 is a view for explaining a shot area and an exposure slit in scanning exposure.

The positions of the mask stage 9 and wafer stage 13 are respectively measured by interferometers 16 and 17, and a mask stage control system 104 and wafer stage control system 105 respectively control the mask stage 9 and wafer stage 13 in accordance with an instruction from a main control system 103 to accurately scan the light beam that illuminates part of the mask pattern in the form of a slit in opposite directions at predetermined velocities at a ratio equal to a projection magnification β of the projection lens 11. In this manner, as shown in FIG. 2, the slit-like light beam continuously scans/exposes an entire exposure area (to be referred to as a "shot area" hereinafter) on the wafer 12 exposed to a mask pattern, thus exposing/transferring the entire mask pattern onto he wafer 12. Referring to FIG. 2, each hatched portion e is a portion of the wafer 12 that is actually exposed, and each dotted portion s indicates the slit. The movement of a light beam between the respective shot areas on the wafer 12 is performed by XY-driving the wafer stage 13.

After all desired shot areas on the wafer 12 are completely exposed, the wafer 12 is transferred outside the exposure apparatus from the wafer stage 13 through a wafer recovery/transfer system 18. At the same time, the next wafer is supplied onto the wafer stage 13 via a wafer supply/transfer system 19 (identical to the wafer recovery/transfer system 18 in FIG. 1 for the sake of illustrative convenience). Thereafter, an alignment system (not shown) performs positioning with the pattern that has already been formed on the wafer 12. According to one alignment method, the positions of alignment marks mainly formed on peripheral portions of a plurality of shot areas selected on the wafer 12 to obtain rotation, expansion/contraction, and shift offsets, and the like of the wafer 12, thereby positioning all shot areas on the wafer 12. Coarse alignment for the detection of alignment marks is sometimes performed before this fine alignment. After each shot area is positioned in this manner, the above exposure operation is repeatedly performed.

A procedure for obtaining a scanning velocity at which a maximum throughput can be obtained will be described next.

A "throughput" will indicate the number of wafers exposed by the apparatus per unit time under a proper exposure under conditions for proper exposure hereinafter.

The "number of wafers processed" to be described later indicates the number of wafers processed by the apparatus per unit time regardless of whether conditions for proper exposure are set or not.

First, in a scanning exposure apparatus, a maximum scanning velocity Vmax is substantially determined, which is determined from the performance of a system control system, including structure and mechanical performance, in order to attain desired imaging performance and overlay accuracy. That is, if scanning exposure is performed at this velocity or higher, a desired fine integrated circuit pattern cannot be formed or a desired overlay accuracy cannot be ensured. Therefore, a scanning velocity V must satisfy $$V \leq Vmax \tag{6}$$

Second, a proper exposure amount D is determined depending on the type of resist to be used and an exposure process to properly form a circuit pattern on the mask 10. In scanning exposure, exposure amount control is performed to set the exposure amount at each point on the wafer 12 to the above proper exposure amount D. Letting Imax be the maximum exposure illuminance in scanning exposure and Ws be the slit width on the wafer 12 in the scanning direction, the scanning velocity V must satisfy $$Vd = Imax/D \times Ws \tag{7}$$

$$V \leq Vd \tag{8}$$

If the scanning velocity V must be set to be lower than Vd, the illuminance must be decreased. As methods of decreasing the illuminance, for example, the following methods are available: a method of decreasing the illuminance by decreasing the energy per laser pulse; a method of decreasing the illuminance by attenuating pulsed light by using a light attenuation means such as an ND filter set on an optical path; a method of decreasing the illuminance by decreasing the pulse oscillation frequency; and a combination of these methods.

Third, with a reduction in the size of an IC pattern, the illuminance evenness of exposure light is required for the performance of the exposure apparatus. However, pulsed light from a pulsed light source such as an excimer laser varies in energy for each pulse. For this reason, exposure must be performed with the number of pulses equal to or more than a predetermined pulse count Pmin at each point on a wafer to integrate pulse energy so as to maintain predetermined illuminance evenness.

Letting fmax be the maximum oscillation frequency of the exposure light source, therefore, the scanning velocity V must satisfy $$Vp = Ws/Pmin \times fmax \tag{9}$$

$$V \leq Vp \tag{10}$$

Fourth, without any consideration given to the first to third conditions, letting Vt be the maximum scanning velocity at which the number of wafers that can be processed by the apparatus per unit time (to be referred to as "the number of wafers processed" hereinafter) is maximized, in order to prevent a decrease in throughput, the scanning velocity V must satisfy $$V \leq Vt \tag{11}$$

The above scanning velocity Vt will be described next.
Letting T (sec) be the time required to process one wafer, the number N of wafers processed per unit time is defined by $$N = 3600/T \tag{12}$$

An example of a breakdown of the time T required to process one wafer can be expressed as follows. Letting Tload (sec) be the time required to supply a wafer, Talign (sec) be the time required for alignment, Tscan (sec) be the time required for scanning exposure, and Tunload (sec) be the time required to recover the wafer, then the time T is defined by $$T = Tload + Talign + Tscan + Tunload \tag{13}$$

Tload, Talign, Tscan, and Tunload are the functions of the wafer stage velocity and acceleration, shot size, shot layout, and the like and can be expressed as follows:
Tload=Tload (Vsl, αsl, ...)
Talign=Talign (Vsa, αsa, Layout_align, Vscan, αscan, ...)
Tscan=Tscn (Vscan, αscan, Vstep, αstep, layout_shot, Size_shot, ...)
Tunload=Tunload (Vsul, αsul, Layout_shot, Vscan, αscan, ...)
T=Tload+Talign+Tscan +Tunload
where
Vsl (mm/sec): wafer stage velocity in supplying wafer
αsl (mm/sec$^2$): wafer stage acceleration in supplying wafer
Vsa (mm/sec): wafer stage velocity during alignment
αsa (mm/sec$^2$): wafer stage acceleration during alignment
Layout_align: layout at alignment mark measurement position
Vscan (mm/sec): wafer stage/mask stage velocity during scanning exposure
αscan (mm/sec ): wafer stage/mask stage acceleration during scanning exposure
Vstep (mm/sec): wafer stage velocity during movement of shot area
αstep (mm/sec$^2$): wafer stage acceleration during movement of shot area
Layout_shot: shot layout
Size_shot: size of shot area
Vul (mm/sec): wafer stage velocity in wafer recovery
αul (mm/sec$^2$): wafer stage acceleration in wafer recovery
For the sake of simplicity, the communication time and computation time required for software to control driving of the wafer stage 13, mask stage 9, and the like, alignment mark measurement time, and the like are omitted, and each velocity and acceleration are written without discrimination between the wafer stage 13 and the mask stage 9, and between scanning direction, non-scanning direction, accelerating operation, decelerating operation, and the like.

The reason why Talign is a function of the scanning velocity Vscan and scanning acceleration α scan is that movement from the final shot in alignment to the scanning start position for the first exposure shot is included. The scanning start position is a position spaced apart from a shot area to be exposed by an acceleration distance required to reach a desired scanning velocity. Scanning of the wafer stage 13 is started from this position. If, therefore, the scanning acceleration αscan remains the same, the acceleration distance required to reach the scanning velocity Vscan decreases as the scanning acceleration Vscan decreases, and vice versa. Since the moving distance from the alignment final measurement position to the first exposure shot start position changes, the moving time also changes. For this reason, Talign is a function of the scanning velocity Vscan and scanning acceleration αscan. Likewise, the reason why Tunload is a function of the scanning velocity Vscan and scanning acceleration αscan is that movement from the scanning exposure end position in the final shot to the wafer recovery position is included.

As the wafer stage velocity and acceleration in supplying a wafer, the maximum values in terms of the capacity of the apparatus are used to minimize the time Tload required to supply the wafer. The time Tload remains constant regardless of the scanning velocity Vscan. As the wafer stage velocity and acceleration during alignment, the maximum values in terms of the capacity of the apparatus are used to minimize the time Talign required for alignment. Strictly speaking, although Talign is a function of the scanning velocity Vscan, since alignment is performed by sequentially measuring alignment marks in a plurality of shot areas, the difference between the scanning velocity Vscan and the scanning acceleration αscan has little influence on the time Talign. Hence, this time can substantially be regarded as a constant value regardless of the scanning velocity Vscan. In addition, the time Tunload required for wafer recovery is also a function of the scanning velocity Vscan. Likewise, this time can substantially be regarded as a constant value regardless of Vscan.

Therefore, the number N of wafers processed per unit time is substantially determined by the time Tscan required for scanning exposure.

The relationship between the time required for scanning exposure, the wafer stage velocity, and the mask stage velocity will be described next with reference to FIGS. 3A and 4.

Figure 3A:
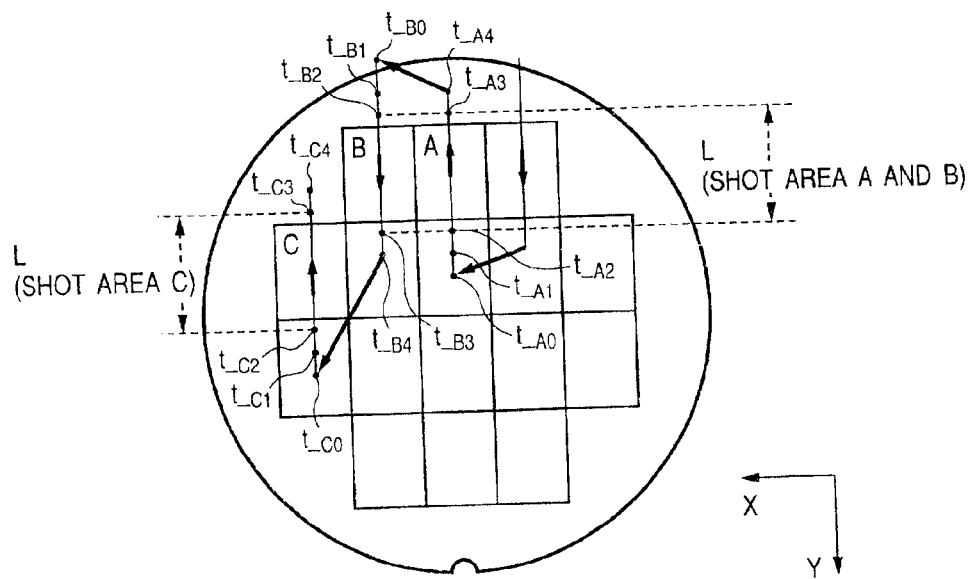
FIG. 3A is a view for explaining a shot layout on a wafer and an exposure order in an exposure apparatus according to the first embodiment of the present invention.

FIG. 3A schematically shows the layout of shot areas. Each arrow indicates the scanning route of the slit. The exposure order is S→A→B→C→.... The slit is relatively scanned upward in a shot area A and downward in a shot area B.

Figure 4:
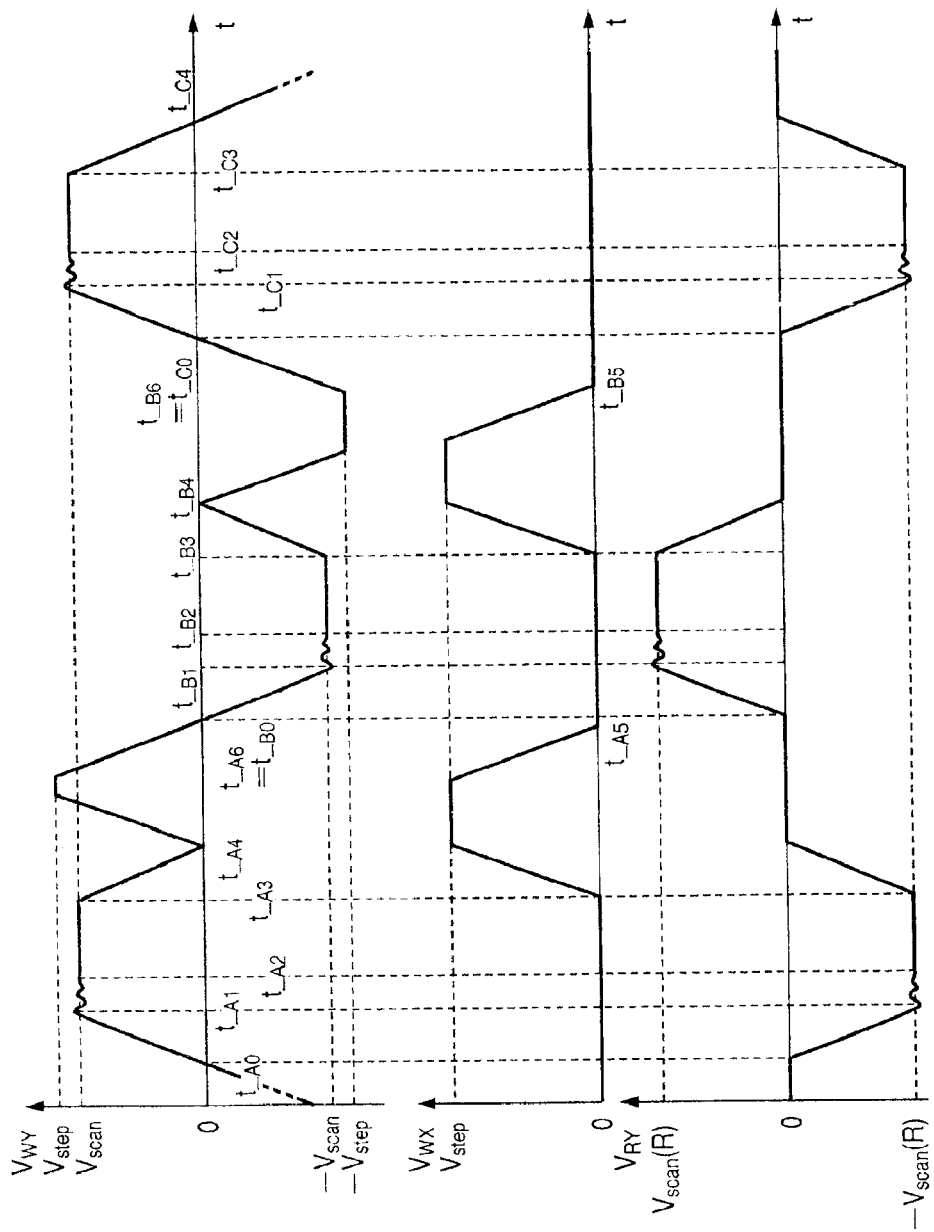
FIG. 4 is a chart showing the relationship between the wafer stage velocity and the time in scanning exposure according to the first embodiment of the present invention.

FIG. 4 shows an example of the relationship among the time, the wafer stage velocity, and the mask stage velocity. In this case, the scanning direction coincides with the Y-axis, and the non-scanning direction coincides with the X-axis. Referring to FIG. 4, the upper, intermediate, and lower charts schematically show the relationships between the velocity of the wafer stage 13 in the Y-axis direction and the time, between the velocity of the wafer stage 13 in the X-axis direction and the time, and between the velocity of the mask stage 9 in the Y-axis direction and the time, respectively.

The wafer stage 13 starts to accelerate from a velocity of 0 at time t_A0 with an average acceleration αaccel, and reaches the scanning velocity Vscan at time t_A1. Then, after a lapse of a time tsettle required to settle the synchronization error between the wafer stage 13 and the mask stage 9 within a predetermined precision range, exposure is started at time t_A2. The distance that the wafer stage 13 travels until this exposure start time is considered in advance as an approach distance to set the position of the wafer stage 13 at time t_A0. As shown in FIG. 2, a distance L required for scanning an entire shot area at a constant velocity is the sum of a length Ly of the shot area in the scanning direction and the length Ws of the slit in the scanning direction. The exposure time is therefore given by L/Vscan=(Ly+Ws)/Vscan. The exposure ends at time t_A3. The wafer stage 13 then starts decelerating with an average acceleration αdecel, and reaches the velocity 0 at time t_A4. Thereafter, the wafer stage 13 starts driving toward an approach start position for exposure of the shot area B. At time t_A6 (=t_B0), this driving operation ends.

With regard to the non-scanning direction, the wafer stage 13 starts driving by a length Lx of the shot area in the non-scanning direction at time t_A3 at which the exposure is terminated. At time t_A5, this driving operation ends. For the sake of simplicity, assume that time t_A5 is earlier than an exposure start time t_B2 for the shot area B. The mask stage 9 also starts decelerating at time t_A0, like the wafer stage 13, and reaches the velocity 0 at time t_A4. However, a scanning velocity Vscan (R) of the mask stage 9 differs from that of the wafer stage 13 by the projection magnification β.

Similarly, it takes the time period between time t_B0 and time t_B6 to expose the shot area B; and the time period between time t_C0 and time t_C6 to expose a shot area C.

In this case, the step times in the scanning direction between t_A4 and t_A6, t_B4 and t_B6, and t_C4 and t_C6, and the step times in the non-scanning direction between t_A3 and t_A5, and t_B3 and t_B5 are determined regardless of the scanning velocity Vscan as long as a shot layout and scanning order are determined.

The time period between scanning start time t_A0 and scanning end time t_A4 is expressed as follows:

$$t\_A1 - t\_A0 = V\text{scan}/\alpha\text{accel}$$

$$t\_A2 - t\_A0 = V\text{scan}/\alpha\text{accel} + t\text{settle}$$

$$t\_A3 - t\_A0 = V\text{scan}/\alpha\text{accel} + t\text{settle} + L/V\text{scan}$$

$$t\_A4 - t\_A0 = V\text{scan}/\alpha\text{accel} + t\text{settle} + L/V\text{scan} + V\text{scan}/\alpha\text{decel}$$

Therefore, a time period tscan(Vscan) from the start of scanning of a shot area to the end of scanning is given by $$t\text{scan}(V\text{scan}) = V\text{scan}/\alpha\text{accel} + t\text{settle} + L/V\text{scan} + V\text{scan}/\alpha\text{decel} \quad (14)$$

Since the accelerations αaccel and αdecel take the maximum values in terms of the capacity of the apparatus to shorten the acceleration and deceleration times, these values can be regarded as constant values. A differential of the second order taking Vscan as a variable is expressed as follows $$\partial^2/\partial V^2 \text{scan} = 2 \times L/V^3 \geq 0.$$

Therefore, tscan(Vscan) is a function exhibiting a characteristic in an inverted convex form, and takes a minimum value. A scanning velocity Vscan.min that minimizes the time period from the start of scanning of a shot area to the end of scanning is given by $$V\text{scan.min} = \sqrt{\{L \times \alpha\text{accel} \times \alpha\text{decel}/(\alpha\text{accel} + \alpha\text{decel})\}}$$

Letting Tstep be the sum of the step times in the scanning direction between t_A4 and t_A6, t_B4 and t_B6, t_C4 and t_C6, ..., and Nshot be the number of shot areas per wafer, the time Tscan required for scanning exposure is given by $$T\text{scan} = T\text{step} + N\text{shot} \times t\text{scan}(V\text{scan}).$$

The time T required to process one wafer is given by $$T = T\text{load} + T\text{align} + T\text{scan} + T\text{unload} \quad (15)$$

$$= T\text{load} + T\text{align} + \{T\text{step} + N\text{shot} \times t\text{scan}(V\text{scan})\} + T\text{unload}$$

As described above so far, all the times except for Tscan(Vscan) need not be regarded as functions of Vscan, and are constant values, and hence, the time T required to process one wafer at the scanning velocity Vscan.min takes a minimum value. That is, the maximum number of wafers processed is set.

Therefore, the scanning velocity Vt at which the maximum number of wafers processed is set is expressed as $$Vt = V\text{scan.min} \tag{16}$$

As described above, since the scanning velocity V must satisfy equations (6), (8), (10, and (11), the scanning velocity V at which the throughput is substantially maximized is given by $$V = \min(V\text{max}, Vd, Vp, Vt)$$

where min( ) is a function for obtaining a minimum value.

Figure 7A:
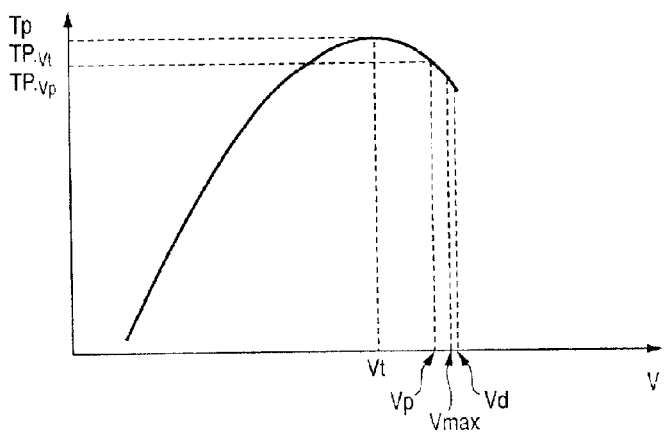
FIG. 7A is a graph showing the relationship between the scanning velocity and the throughput.

According to equations (12), (14), and (15), the relationship between the scanning velocity and the throughput exhibits the form shown in FIG. 7A. Assume that Vmax, Vd, Vp, and Vt have a relationship like that shown in FIG. 7A (Vt<Vp<Vmax<Vd). In this case, if the conventional method without any consideration given to the scanning velocity Vt at which the number of wafers processed is maximized is used, exposure is performed at the scanning velocity Vp which is high and at which the synchronization error tends to become large, and the throughput at this time become $TP_{Vp}$. If the method of the present invention is used, exposure is performed at the scanning velocity Vt which is lower than Vp and advantageous in terms of synchronization precision, and the throughput at this time is $Tp_{Vt}$.

As is obvious from FIG. 7A, since $TP_{Vp} \leq TP_{Vt}$, the productivity can be improved.

(Second Embodiment)

Figure 3B:
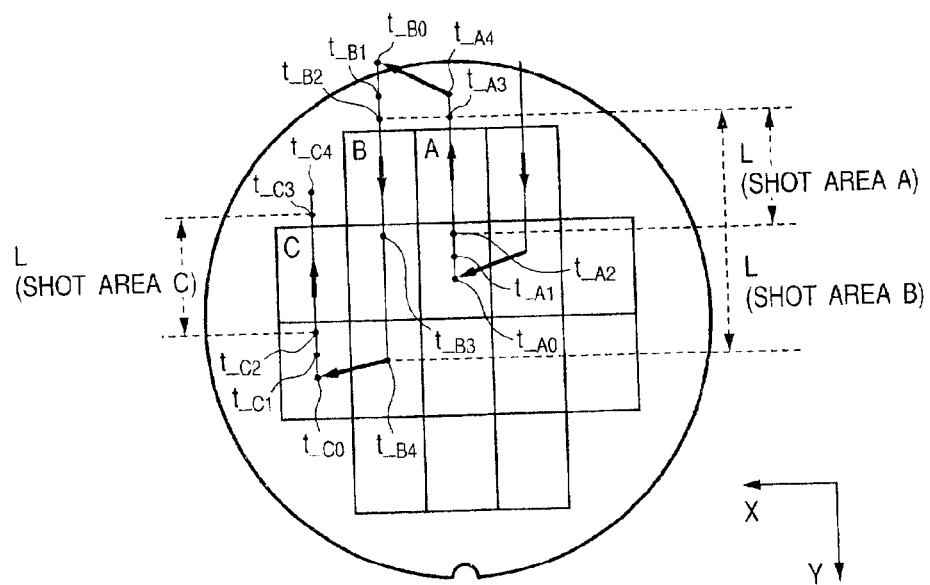
FIG. 3B is a view for explaining a shot layout on a wafer and an exposure order in an exposure apparatus according to the second embodiment of the present invention.
Figure 5:
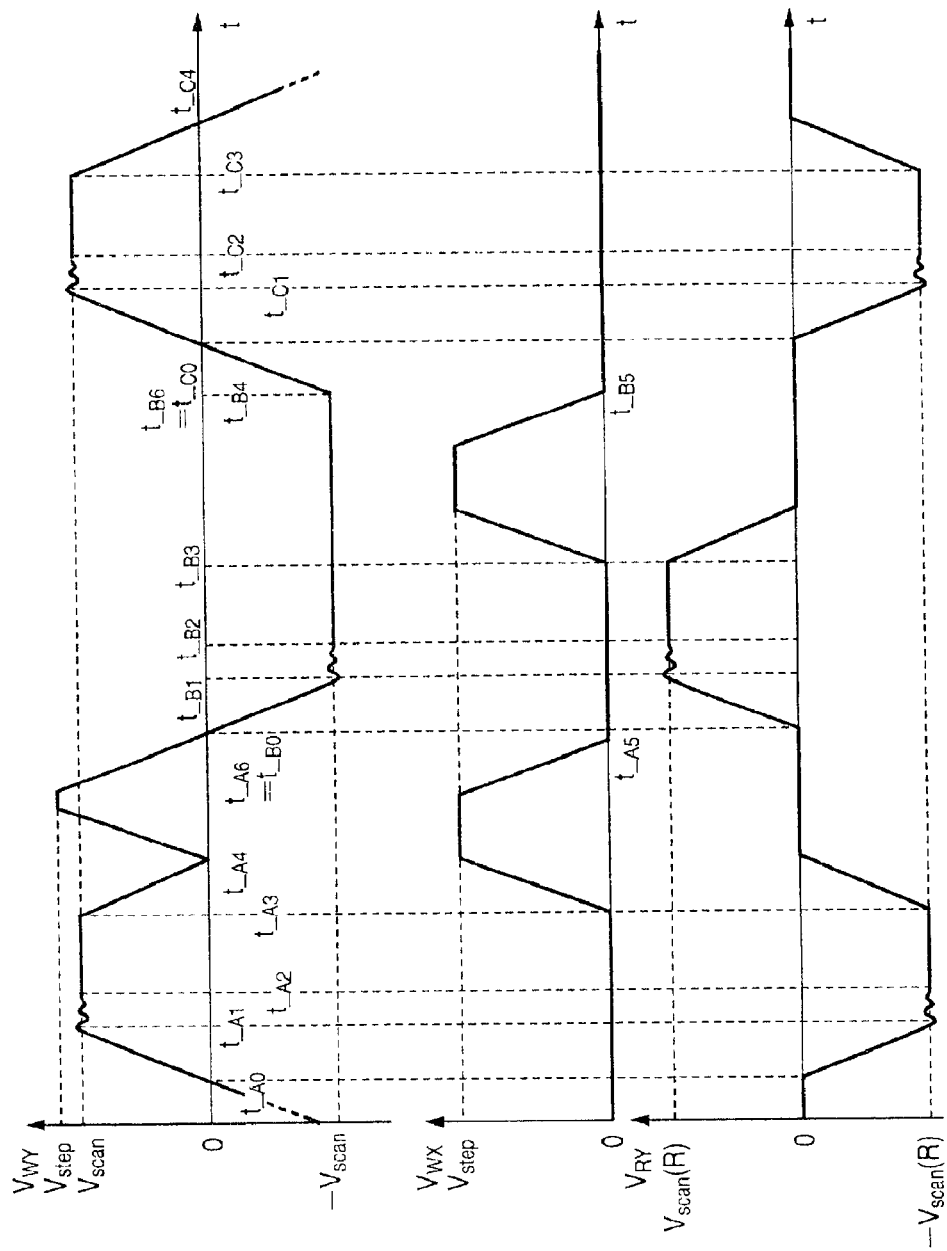
FIG. 5 is a chart showing the relationship between the wafer stage velocity and the time in scanning exposure according to the second embodiment of the present invention.

The second embodiment of the present invention will be described. In this case, FIGS. 3B and 5 show the relationship between the shot layout on a wafer, the wafer stage velocity, and the mask stage velocity.

When a slit-like light beam moves from a shot area B to a shot area C, the wafer stage starts decelerating at exposure end time t_B3 in FIG. 4. In this case, however, even after the exposure ends at time t_B3, the wafer stage moves at the same velocity as that in the exposure operation, and starts decelerating at time t_B4 to decrease the velocity to 0 at an approach start position for exposure of the shot area C. The wafer stage reaches the approach start position for exposure of the shot area C at time t_B6 (t_C0).

In this case, a length L that the wafer stage scans at a constant velocity in one scanning operation is expressed by L>Ly+Ws instead of L=Ly+Ws. The length L varies for each shot area, and a scanning velocity Vscan.minB in the shot area B is higher than a scanning velocity Vscan.minA that minimizes the time period from the start of scanning of the shot area A to the end of scanning.

In practice, a scanning velocity must be so determined as to satisfy equations (6), (8), and (10) as well. For this reason, a scanning velocity V_A that minimizes the time period from the start of scanning of the shot area A to the end of scanning while satisfying equations (6), (8), and (10) is given by $$V\_A = \min(V\text{max}, Vd, Vp, V\text{scan.minA}).$$

In the shot area B, $$v\_B = \min(V\text{max}, Vd, Vp, V\text{scan.minB}).$$

Figure 7B:
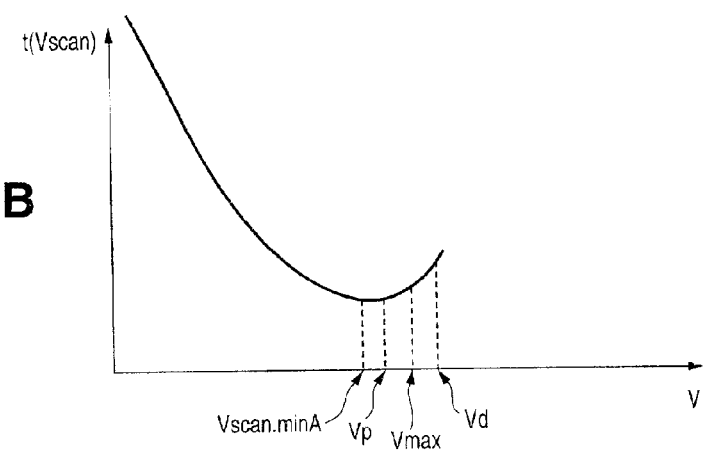
FIG. 7B is a graph showing the relationship between the scanning velocity and the time period from the start of scanning of a shot area to the end of scanning.
Figure 7C:
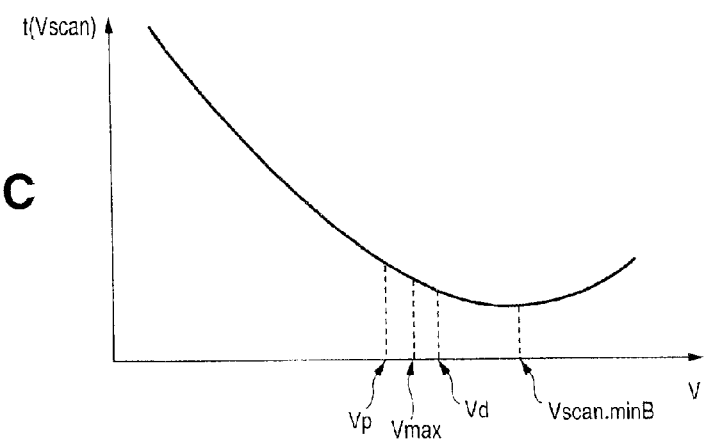
FIG. 7C is a graph showing the relationship between the scanning velocity and the time period from the start of scanning of a shot area to the end of scanning.

Assume that FIG. 7B shows the relationship between the scanning velocity and a time t(Vscan) from the start of scanning of the shot area A to the end of scanning, and FIG. 7C shows the relationship between the scanning velocity and a time t(Vscan) from the start of scanning of the shot area B to the end of scanning. In this case, the above scanning velocities V_A and V_B are respectively given by $$V\_A = V\text{scan.minA}$$

$$V\_B = Vp$$

and hence differ from each other.

If, therefore, the scanning velocity is changed in accordance with the length L that is scanned at a constant velocity in one scanning operation for each shot area, the time required for each shot area can be minimized. As a consequence, the throughput can be maximized.

In the case described above, the slit-like light beam moves from a given shot area to another shot area, which are equal in size but differ in their positions in the Y direction. However, the same applies to a case where shot areas have different sizes within a wafer, because the length L that is scanned at a constant velocity varies.

In the above case, for example, αaccel, αdecel, and tsettle are set to constant values within a wafer, and exposure is performed from the upper right shot area on the wafer in the order of S→A→B→C→. . . . In addition, movement end times t_A5 and t_B5 in the non-scanning direction are set to be earlier than exposure start times t_B2 and t_C2 for the next shot area to prevent movement in the non-scanning direction from influencing the time Tscan required for scanning exposure.

Figure 6A:
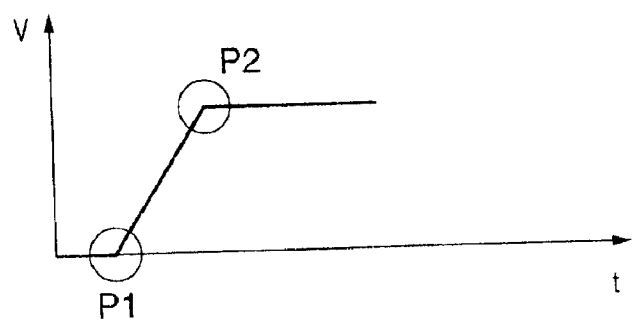
FIG. 6A is a graph for explaining a stage acceleration pattern.
Figure 6B:
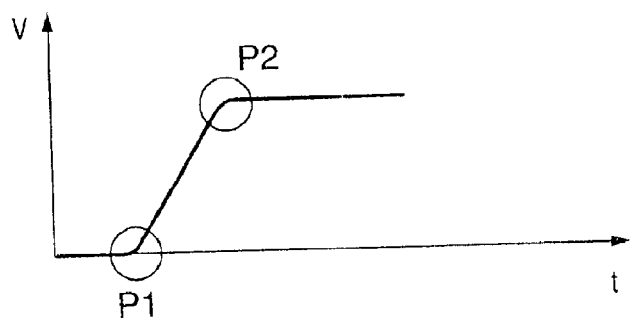
FIG. 6B is a graph for explaining a stage acceleration pattern.

Assume that a different exposure order is set, movement in the non-scanning direction or movement of the mask stage influences the time Tscan required for scanning exposure, and αaccel, αdecel, tsettle, Vstep, and the like vary within a wafer. In this case, if accelerations are determined in accordance with actual stage control in consideration of smooth velocity changes at P1 and P2 as shown in FIG. 6B instead of assuming the average accelerations αaccel and αdecel that abruptly change at P1 and P2 as shown in FIG. 6A, and the accelerations themselves are functions of a scanning velocity, the scanning velocity Vt at which the number of wafers processed is maximized is not necessarily given by equation (16).

In such a case, if representative values αaccel and αdecel within a wafer are used, a relationship similar to that represented by equation (16) is established. Strictly speaking, the scanning velocity Vt at which the number of wafers processed is maximized can be expressed as a function of Vscan.min as follows:

$$Vt = g(V\text{scan.min}) \tag{17}$$

where go is an arbitrary function.

The function go may be actually obtained by one of the following methods. For example, scanning velocities Vt.1, Vt.2, Vt.3, . . . at which the number of wafers processed is maximized are actually obtained under several conditions including the length L that is scanned at a constant velocity in one scanning operation, accelerations, and the like, and these velocities are approximated as a polynomial of Vscan.min. Alternatively, scanning velocities are determined as constant multiples of Vscan.min for the respective conditions and approximated in the form of a table.

According to another method, if an acceleration/deceleration pattern like that shown in FIG. 6A or 6B, including an exposure order and variations within a wafer, is known, a time T required to process one wafer can be calculated. In this case, a time Talign required for alignment and a time Tunload required for wafer recovery, which are regarded as constant values in the above description, may be accurately calculated as functions of a scanning velocity Vscan. If the time T required to process one wafer is calculated in this manner, a scanning velocity Vt at which the number of wafers processed is maximized can be obtained by numerical calculation.

The above embodiments have exemplified the case where a pulse laser is used. Even if, however, a continuous light source like a mercury lamp is used, the scanning velocity V that maximizes the throughput can be obtained by the equation given below in the same manner as described above except that there is no need to consider a velocity Vp controlled with the minimum number of exposure pulses.

$$V=\min(V\max, Vd, Vt)$$

The scanning velocity V for each shot in each shot area in the exposure apparatus according to each embodiment described above is displayed on a display (not shown).

(Embodiment of a Semiconductor Production System)

A production system for producing a semiconductor device (e.g., a semiconductor chip such as an IC or LSI, a liquid crystal panel, a CCD, a thin-film magnetic head, a micromachine, or the like) by using the exposure apparatus according to the present invention will be exemplified. A trouble remedy or periodic maintenance of a manufacturing apparatus installed in a semiconductor manufacturing factory, or maintenance service such as software distribution is performed by using a computer network outside the manufacturing factory.

Figure 8:
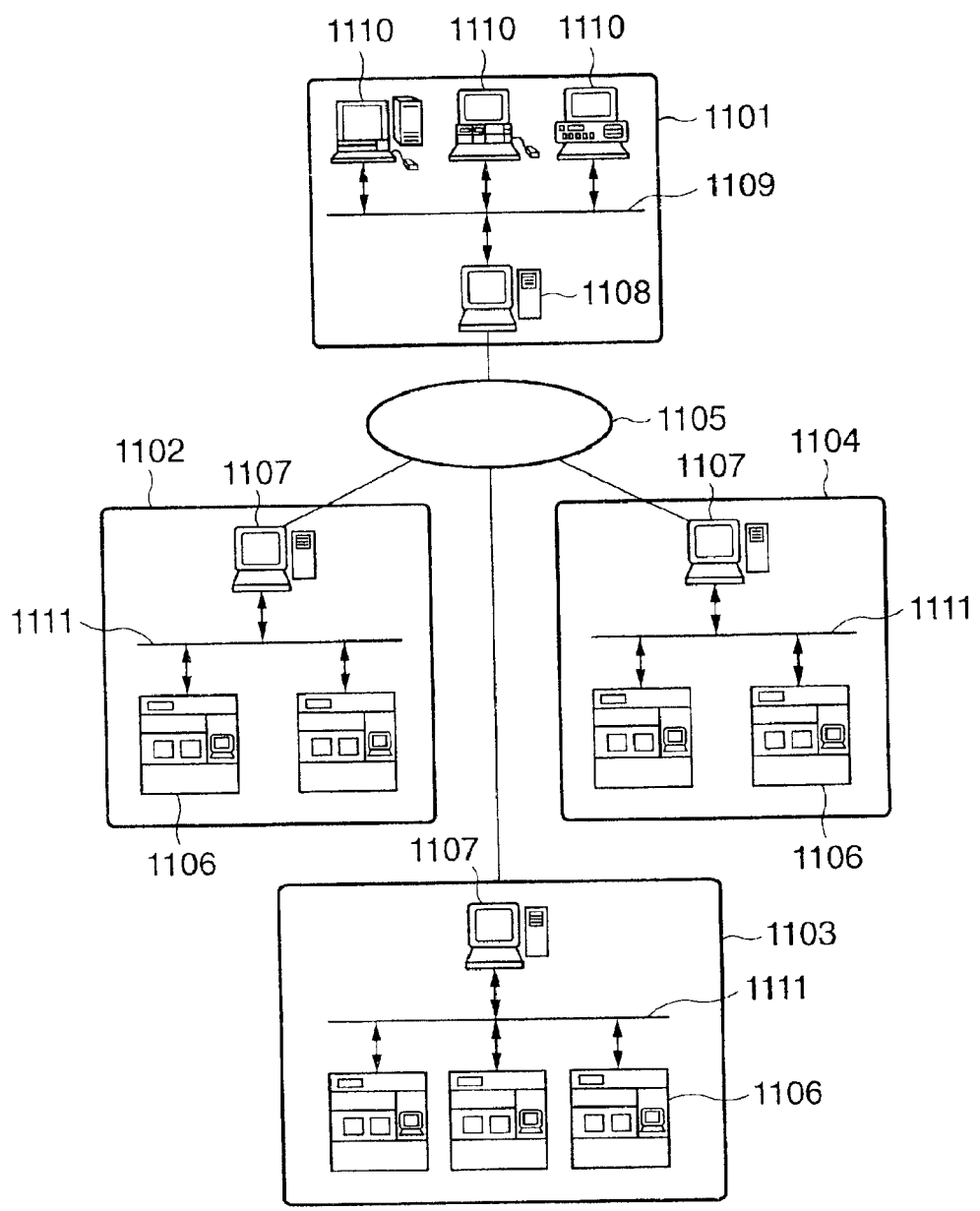
FIG. 8 is a view showing the concept of a semiconductor device production system according to the present invention when viewed from a given angle.

FIG. 8 shows the overall system cut out at a given angle. In FIG. 8, reference numeral 1101 denotes a business office of a vendor (e.g., an apparatus supply manufacturer), which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 1101 comprises a host management system 1108 for providing a maintenance database for the manufacturing apparatus, a plurality of operation terminal computers 1110, and a LAN (Local Area Network) 1109, which connects the host management system 1108 and computers 1110 to build an intranet. The host management system 1108 has a gateway for connecting the LAN 1109 to Internet 1105 as an external network of the business office, and a security function for limiting external accesses.

Reference numerals 1102 to 1104 denote manufacturing factories of the semiconductor manufacturer as users of manufacturing apparatuses. The manufacturing factories 1102 to 1104 may belong to different manufacturers or the same manufacturer (e.g., a pre-process factory, a post-process factory, and the like). Each of the factories 1102 to 1104 is equipped with a plurality of manufacturing apparatuses 1106, a LAN (Local Area Network) 1111, which connects these apparatuses 1106 to construct an intranet, and a host management system 1107 serving as a monitoring apparatus for monitoring the operation status of each manufacturing apparatus 1106. The host management system 1107 in each of the factories 1102 to 1104 has a gateway for connecting the LAN 111 in the factory to the Internet 1105 as an external network of the factory. Each factory can access the host management system 1108 of the vendor 1101 from the LAN 1111 via the Internet 1105. The security function of the host management system 1108 authorizes access of only a limited user. More specifically, the factory notifies the vendor via the Internet 1105 of status information (e.g., the symptom of a manufacturing apparatus in trouble) representing the operation status of each manufacturing apparatus 1106, and receives response information (e.g., information designating a remedy against the trouble, or remedy software or data) corresponding to the notification, or maintenance information such as the latest software or help information. Data communication between the factories 1102 to 1104 and the vendor 1101 and data communication via the LAN 1111 in each factory adopt a communication protocol (TCP/IP) generally used in the Internet. Instead of using the Internet as an external network of the factory, a dedicated network (e.g., an ISDN) having high security which inhibits access of a third party can be adopted. Also, the user may construct a database in addition to the one provided by the vendor and set the database on an external network, and the host management system may authorize access to the database from a plurality of user factories.

Figure 9:
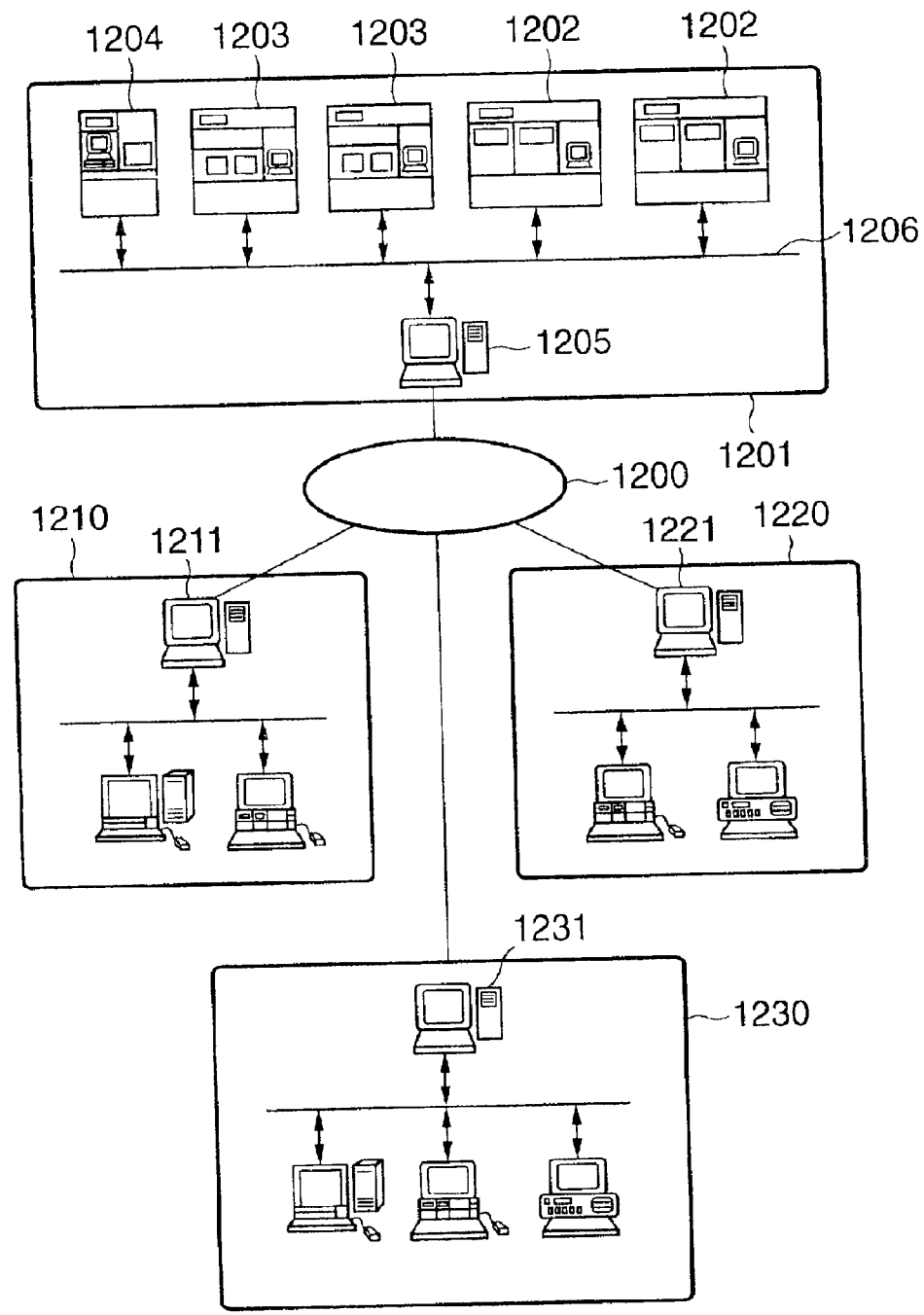
FIG. 9 is a view showing the concept of the semiconductor device production system according to the present invention when viewed from another given angle.

FIG. 9 is a view showing the concept of the overall system of this embodiment that is cut out at a different angle from FIG. 8. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 9, a factory having manufacturing apparatuses of a plurality of vendors and the management systems of the vendors for these manufacturing apparatuses are connected via the external network of the factory, and maintenance information of each manufacturing apparatus is communicated. In FIG. 9, reference numeral 1201 denotes a manufacturing factory of a manufacturing apparatus user (e.g., a semiconductor device manufacturer) where manufacturing apparatuses for performing various processes, (e.g., an exposure apparatus 1202, a resist processing apparatus 1203, and a film formation apparatus 1204 are installed in the manufacturing line of the factory. FIG. 9 shows only one manufacturing factory 1201, but a plurality of factories are networked in practice. The respective apparatuses in the factory are connected to a LAN 1206 to build an intranet, and a host management system 1205 manages the operation of the manufacturing line.

The business offices of vendors (e.g., apparatus supply manufacturers) such as an exposure apparatus manufacturer 1210, a resist processing apparatus manufacturer 1220, and a film formation apparatus manufacturer 1230 comprise host management systems 1211, 1221, and 1231 for executing remote maintenance for the supplied apparatuses. Each host management system has a maintenance database and a gateway for an external network, as described above. The host management system 1205 for managing the apparatuses in the manufacturing factory of the user, and the management systems 1211, 1221, and 1231 of the vendors for the respective apparatuses are connected via the Internet or dedicated network serving as an external network 1200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 1200. This can minimize the stoppage of the manufacturing line.

Each manufacturing apparatus in the semiconductor manufacturing factory comprises a display, a network interface, and a computer for executing network access software and apparatus operating software, which are stored in a storage device. The storage device is a built-in memory, hard disk, or network file server. The network access software includes a dedicated or general-purpose web browser, and provides a user interface having a window as shown in FIG. 10 on the display. While referring to this window, the operator who manages manufacturing apparatuses in each factory inputs, in input items on the windows, pieces of information such as the type of manufacturing apparatus 1401, serial number 1402, object of trouble 1403, occurrence date 1404, degree of urgency 1405, symptom 1406, remedy 1407, and progress 1408. The pieces of input information are transmitted to the maintenance database via the Internet, and appropriate maintenance information is sent back from the maintenance database and displayed on the display. The user interface provided by the web browser realizes hyperlink functions 1410 to 1412, as shown in FIG. 10. This allows the operator to access detailed information of each item, to receive the latest-version software to be used for a manufacturing apparatus from a software library provided by a vendor, and to receive an operation guide (help information) as a reference for the operator in the factory. Maintenance information provided by the maintenance database also includes information concerning the present invention described above. The software library also provides the latest software for implementing the present invention.

Figure 11:
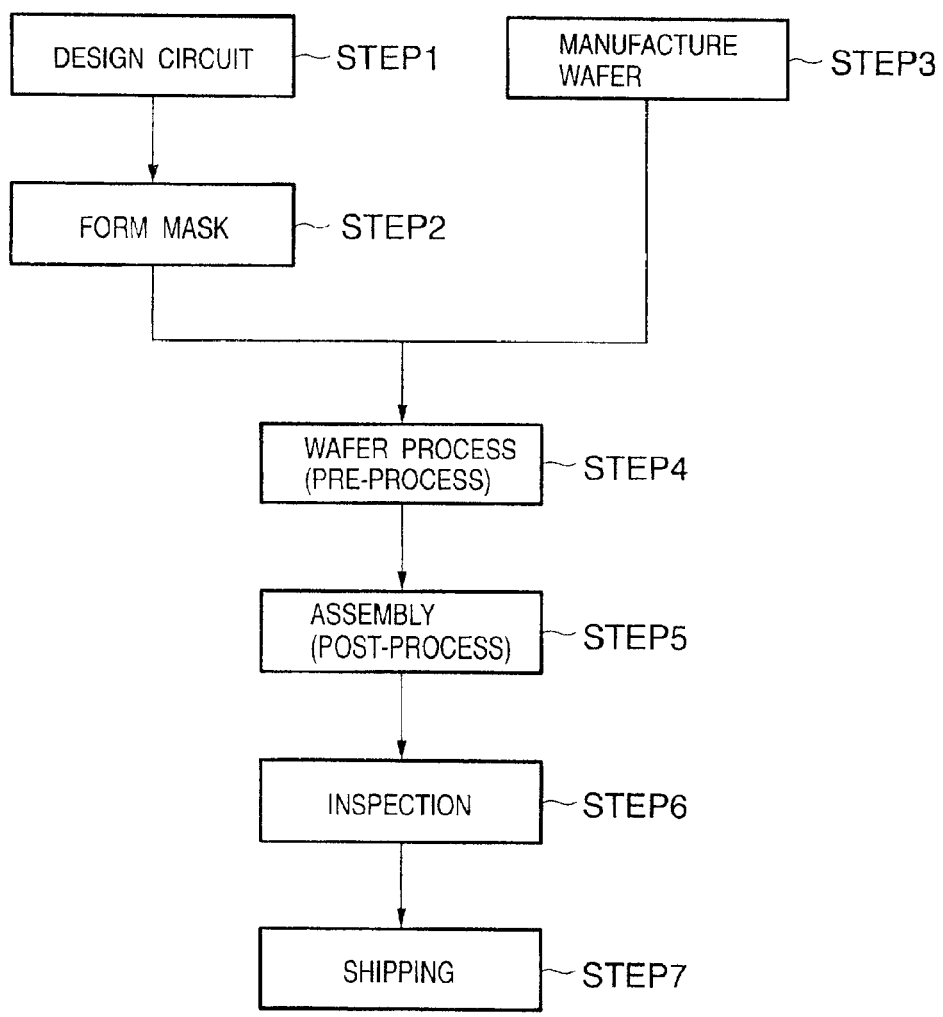
FIG. 11 is a flow chart showing the flow of a semiconductor device manufacturing process according to the present invention.

A semiconductor device manufacturing process using the above-described production system will be explained. FIG. 11 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process), called a pre-process, an actual circuit is formed on the wafer by lithography using a prepared mask and the wafer. Step 5 (assembly), called a post-process is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated network.

Figure 12:
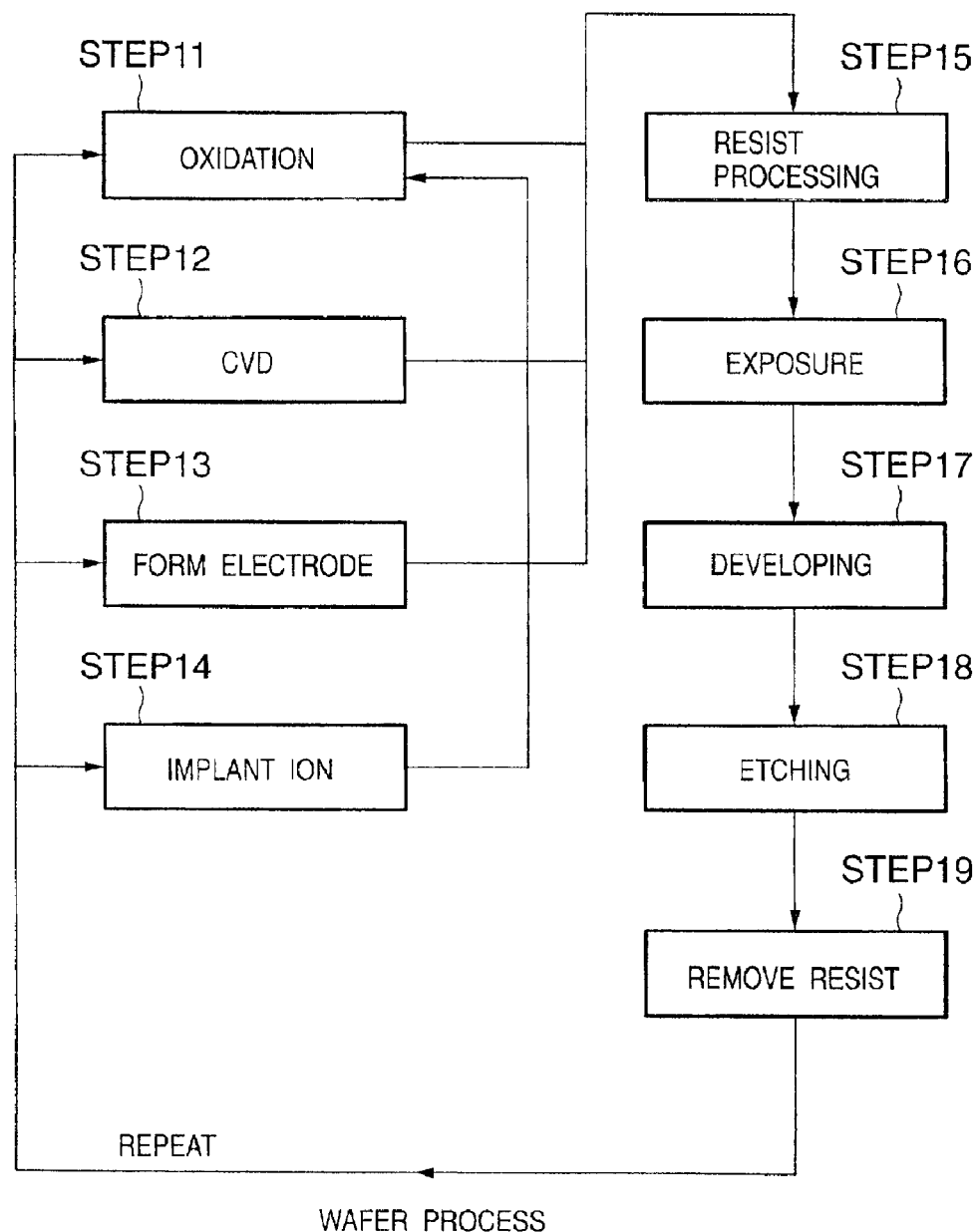
FIG. 12 is a flow chart showing a wafer process in FIG. 11 which is performed by the exposure apparatus according to an embodiment of the present invention.

FIG. 12 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the exposure apparatus described above exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents a trouble in advance. Even if trouble occurs, the manufacturing apparatus can be quickly recovered. The productivity of the semiconductor device can be increased in comparison with the prior art.

According to the present invention, there are provided an exposure apparatus which can perform scanning exposure with a maximum possible throughput by determining a scanning velocity in consideration of the maximum scanning velocity determined from the performance of a stage control system, including structural and mechanical performance, the scanning velocity determined from an exposure amount, the scanning velocity determined from the minimum number of exposure pulses, and the scanning velocity that maximizes the number of substrates such as wafers to be processed, and a device manufacturing method using the exposure apparatus. This makes it possible to increase the throughput while satisfying various constraint conditions.

In addition, the scanning velocity Vt at which the number of substrates processed per unit time is maximized, which is determined from a transfer pattern size, the layout on the transfer pattern, a transfer means, a master scanning means, a substrate scanning means, and a positioning means is calculated in advance by simulation based on a transfer pattern size, the layout on the transfer pattern, and conditions in the transfer means, master scanning means, substrate stage scanning means, and positioning means, or is changed for each transfer pattern in accordance with a transfer pattern size and the layout of the transfer pattern on a substrate. The throughput can be further increased by changing the scanning velocity for each shot area to be exposed in accordance with the length that is scanned at a constant velocity in one scanning operation.

As many apparently widely different embodiments of the present invention can be made without departing from the spirit and scope thereof, it is to be understood that the invention is not limited to the specific embodiments thereof except as defined in the appended claims.

What is claimed is:

1. A scanning exposure apparatus comprising:
    a master stage for scanning a master;
    a substrate stage for scanning a substrate;
    transfer means for supplying/recovering the substrate to/from said substrate stage;
    positioning means for relatively positioning the substrate and the master; and
    scanning velocity determination means for determining a scanning velocity so as to maximize the number of substrates that can be exposed per unit time,
    wherein said scanning velocity determining means determines, as a scanning velocity in an actual exposure operation, a lowest one of:
    (i) a maximum scanning velocity determined from apparatus performance: Vmax,
    (ii) a scanning velocity determined from an exposure illuminance and a required exposure amount: Vd, and
    (iii) a scanning velocity at which the number of substrates that can be processed per unit time is maximized, which is determined from the transfer pattern size, a layout of the transfer pattern on the substrate, said transfer means, said master scanning means, said substrate stage scanning means, and said positioning means: Vt.

2. The apparatus according to claim 1, wherein the scanning velocity Vd satisfies:

$$Vd = I\max/D \times Ws$$

where Imax is a maximum exposure illuminance, and D is a required exposure amount determined by a photosensitive material.

3. The apparatus according to claim 1, wherein the scanning velocity Vt satisfies:

$$Vscan.\min = \sqrt{\{L \times \alpha accel \times \alpha decel / (\alpha accel + \alpha decel)\}}$$

$$Vtscan = g(Vscan.\min)$$

where αaccel is an average acceleration with which an increase in scanning velocity from 0 to Wt is achieved, αdecel is an average acceleration with which a decrease in scanning velocity from Vt to 0 is achieved, L is a length on the substrate which is scanned at a constant velocity in one scanning operation, and g( ) is an arbitrary function.

4. The apparatus according to claim 1, wherein the scanning velocity Vt is calculated by simulation to maximize the number of substrates that can be processed per unit time on the basis of the transfer pattern size, a layout of the transfer pattern on the substrate, and conditions in said master scanning means, said substrate stage scanning means, said transfer means, and said positioning means.

5. The apparatus according to claim 1, wherein the scanning velocity Vt is changed for each transfer pattern in accordance with the transfer pattern size and the layout of the transfer pattern on the substrate.

6. The apparatus according to claim 5, wherein the scanning velocity Vt changes in accordance with a length that is scanned at a constant velocity for each shot area in one scanning operation.

7. A scanning exposure apparatus comprising:
   a master stage for scanning a master;
   a substrate stage for scanning a substrate;
   transfer means for supplying/recovering the substrate to/from said substrate stage;
   positioning means for relatively positioning the substrate and the master; and
   scanning velocity determination means for determining a scanning velocity so as to maximize the number of substrates that can be exposed per unit time,
   wherein said light source is a light source for emitting pulsed light, and said scanning velocity determining means determines, as a scanning velocity in an actual exposure operation, a lowest one of:
   (i) a maximum scanning velocity determined from apparatus performance: Vmax,
   (ii) a scanning velocity determined from an exposure illuminance and a required exposure amount: Vd,
   (iii) a scanning velocity determined from the minimum number of pulses which is required for integration to ensure a uniform exposure amount: Vp, and
   (iv) a scanning velocity at which the number of substrates that can be processed per unit time is maximized, which is determined from the transfer pattern size, a layout of the transfer pattern on the substrate, said transfer means, said master scanning means, said substrate stage scanning means, and said positioning means: Vt.

8. The apparatus according to claim 7, wherein the scanning velocity Vp satisfies:

$$VP = Ws / P\min \times f\max$$

where Ws is a width of an illumination area, on the substrate in a scanning direction, which illuminates part of the transfer pattern, fmax is a maximum frequency of pulsed light emitted from said light source, and Pmin is the minimum number of pulses required for integration to ensure a uniform exposure amount on the substrate.

9. A scanning exposure apparatus for sequentially transferring a pattern on a master to each shot area on a substrate through a projection optical system by synchronously scanning the master and the substrate for the projection optical system, said apparatus comprising:
   a stage for scanning the master; and
   scanning velocity determination means for determining a scanning velocity on the basis of a length of the pattern in a scanning direction.

10. A scanning exposure apparatus for sequentially transferring a pattern on a master to each shot area on a substrate through a projection optical system by synchronously scanning the master and the substrate for the projection optical system, said apparatus comprising:
   a stage for scanning the master; and
   scanning velocity determination means for determining a scanning velocity on the basis of a length on the shot area which is scanned at a constant velocity.

11. The apparatus according to claim 10, wherein the scanning velocity may be changed for each shot area.

12. A scanning exposure apparatus for sequentially transferring a pattern on a master to each shot area on a substrate through a projection optical system by synchronously scanning the master and the substrate for the projection optical system, said apparatus comprising:
   a stage for scanning the master; and
   a controller for controlling scanning of the stage at a scanning velocity so as to maximize the number of substrates that can be exposed per unit time,
   wherein the scanning velocity for controlling scanning of the stage by said controller is determined from a plurality of velocities including a velocity so as to maximize a time period from a start of scanning of a shot area to an end of scanning.

13. A scanning exposure apparatus for sequentially transferring a pattern on a master to each shot area on a substrate through a projection optical system by synchronously scanning the master and the substrate for the projection optical system, said apparatus comprising:
   a stage for scanning the master; and
   scanning velocity determination means for determining a scanning velocity so as to maximize the number of shots that can be exposed per unit time,
   wherein said scanning velocity determination means determines, as a scanning velocity in an actual exposure operation, a lowest one of
   (i) a maximum scanning velocity determined from apparatus performance: Vmax,
   (ii) a scanning velocity determined from an exposure illuminance and a required exposure amount: Vd, and
   (iii) a scanning velocity at which the number of shots that can be processed per unit time is maximized, which is determined from the shot size; Vt.

* * * * *

UNITED STATES PATENT AND TRADEMARK OFFICE
CERTIFICATE OF CORRECTION

PATENT NO. : 6,891,175 B2
DATED : May 10, 2005
INVENTOR(S) : Mitsuru Hiura

It is certified that error appears in the above-identified patent and that said Letters Patent is hereby corrected as shown below:

Column 2,
Line 50, the first occurrence of "a" should be deleted.

Column 6,
Line 38, "he" should read -- the --.

Column 8,
Line 33, "(mm/sec ):" should read -- (mm/sec$^2$): --.

Column 11,
Line 9, "(10," should read -- (10), --.
Line 26, "become" should read -- becomes --.

Column 12,
Lines 51 and 52, "go" should read -- g( ) --.

Column 16,
Line 1, "a" should be deleted.

Column 17,
Line 10, "acceleration" should read -- deceleration --.
Line 59, "VP=" should read -- Vp= --.

Column 18,
Line 22, "length on" should read -- length of --.
Line 61, "size; Vt." should read -- size: Vt. --.

Signed and Sealed this

Fourth Day of October, 2005

JON W. DUDAS
*Director of the United States Patent and Trademark Office*

UNITED STATES PATENT AND TRADEMARK OFFICE
CERTIFICATE OF CORRECTION

PATENT NO. : 6,891,175 B2
DATED : May 10, 2005
INVENTOR(S) : Hiura

It is certified that error appears in the above-identified patent and that said Letters Patent is hereby corrected as shown below:

<u>Title page,</u>
Item [*] Notice, "by 301 days" should be deleted and replaced with -- by 421 days --.

Signed and Sealed this

First Day of November, 2005

JON W. DUDAS
*Director of the United States Patent and Trademark Office*